US00H002094H

(19) United States

(12) Statutory Invention Registration

Condron et al.

(10) Reg. No.: US H2094 H

(43) Published: Jan. 6, 2004

(54) DIAGNOSTIC CIRCUIT FOR VEHICLE DEVICE CONTROL MODULE

(75) Inventors: Dean Edward Condron, Grand Blanc, MI (US); Thomas Stierle, Auburn Hills, MI (US)

(73) Assignee: Siemens VDO Automotive Corporation, Auburn Hills, MI (US)

(21) Appl. No.: 10/413,781

(22) Filed: Apr. 15, 2003

(65) Prior Publication Data

US 2003/0214308 A1 Nov. 20, 2003

Related U.S. Application Data

(60) Provisional application No. 60/396,354, filed on Jul. 16, 2002, and provisional application No. 60/380,703, filed on May 15, 2002.

(51) Int. Cl.[7] ..... G01R 31/02

(52) U.S. Cl. ..... 324/549; 340/438; 280/735; 307/10.1

*Primary Examiner*—Daniel T. Pihulic

(74) *Attorney, Agent, or Firm*—Carlson, Gaskey & Olds P.C.

(57) ABSTRACT

A control module for a vehicle device control system contains a diagnostic circuit with one or more ASICs having a plurality of loops. The loops may contain either a squib, forming a squib loop, or a replacement resistor, forming a replacement resistor loop. A multiplexer connected to one loop of the ASIC diagnoses all of the replacement resistor loops. By using a multiplexer to detect replacement resistors, the invention eliminates the need to include an additional ASIC just to diagnose the replacement resistor loops.

7 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

DIAGNOSTIC CIRCUIT FOR VEHICLE DEVICE CONTROL MODULE

REFERENCE TO RELATED APPLICATIONS

This application claims the benefit of U.S. Provisional Appln. Nos. 60/380,703, filed May 15, 2002; and 60/396,354, filed July 16, 2002.

TECHNICAL FIELD

The present invention relates to vehicle control modules, and more particularly to a vehicle control module that controls deployment of squib-activated vehicle devices.

BACKGROUND OF THE INVENTION

Control modules for controlling deployment of vehicle devices, such as airbags, in vehicles rely on application specific integrated circuits (ASICs) populated with one or more diagnostic loops. In these systems, diagnostic loops associated with vehicle devices each contain a squib, which has a very low resistance on the order of 2 ohms, that explodes or fires when a high current is sent through it in response to a detected vehicle condition. In airbag systems, firing the squib causes the airbag associated with that squib to inflate. Squibs can be associated with other vehicle safety devices as well, but airbags will be discussed below for simplicity.

Many control modules are designed so that they can contain a high and low number of loops containing squibs, thereby allowing the same control module to be used in different vehicle designs. For example, a given control module may contain either thirteen squib loops (high) or seven squib loops (low). If the module contains seven squib loops, replacement resistors can be placed in all six unused squib loops in place if necessary. These replacement resistors have higher resistance values than the squibs so that diagnostic circuitry within the airbag system can distinguish between the squib and the replacement resistor.

The replacement resistors are used to prevent misbuilds at the vehicle plant and during the service life of the vehicle. For example, to protect the correct configuration of the vehicle, replacement resistors can be used in the seats and headliners in the vehicle. This is done for two reasons. First, seats and headliners containing airbags are designated with a label marked "Airbag." A misbuild may cause the owner to incorrectly believe that a seat or headliner has airbag protection when it actually does not, causing customer dissatisfaction. Second, it is expensive to give away airbags in seats and headliners in a vehicle that is not configured to have such devices. The ASICs prevent these types of misbuilds by detecting the different resistance levels of the squibs and the replacement resistors and making sure that the number of detected squibs and replacement resistors in the control module match the vehicle design.

Previously known designs, which contain a smaller total number of loops, could be diagnosed by one ASIC. Designs having a larger number of loops and having a large difference between the high and low numbers of loops may require more than one ASIC to diagnose. In this case, however, one of the ASICs may be populated solely to detect the replacement resistors. The additional ASIC undesirably increases the cost of the diagnostic circuitry.

There is a desire for a control module that can diagnose the presence of replacement resistors without requiring additional ASICs to conduct the diagnosis.

SUMMARY OF THE INVENTION

The present invention is directed to a control module having a diagnostic circuit. The diagnostic circuit contains one or more ASICs having a plurality of loops. The loops may contain either a squib, forming a squib loop, or a replacement resistor, forming a replacement resistor loop. Rather than populating an additional ASIC simply to diagnose the replacement resistor loops, the invention connects a multiplexer to one loop of the ASIC and uses the multiplexer to diagnose the replacement resistor loops.

By using a multiplexer to detect replacement resistors, the invention eliminates the need to include an additional ASIC to diagnose replacement resistor loops. Instead, a single ASIC loop can be used to diagnose multiple replacement resistors.

DETAILED DESCRIPTION OF THE EMBODIMENTS

Figure 1:
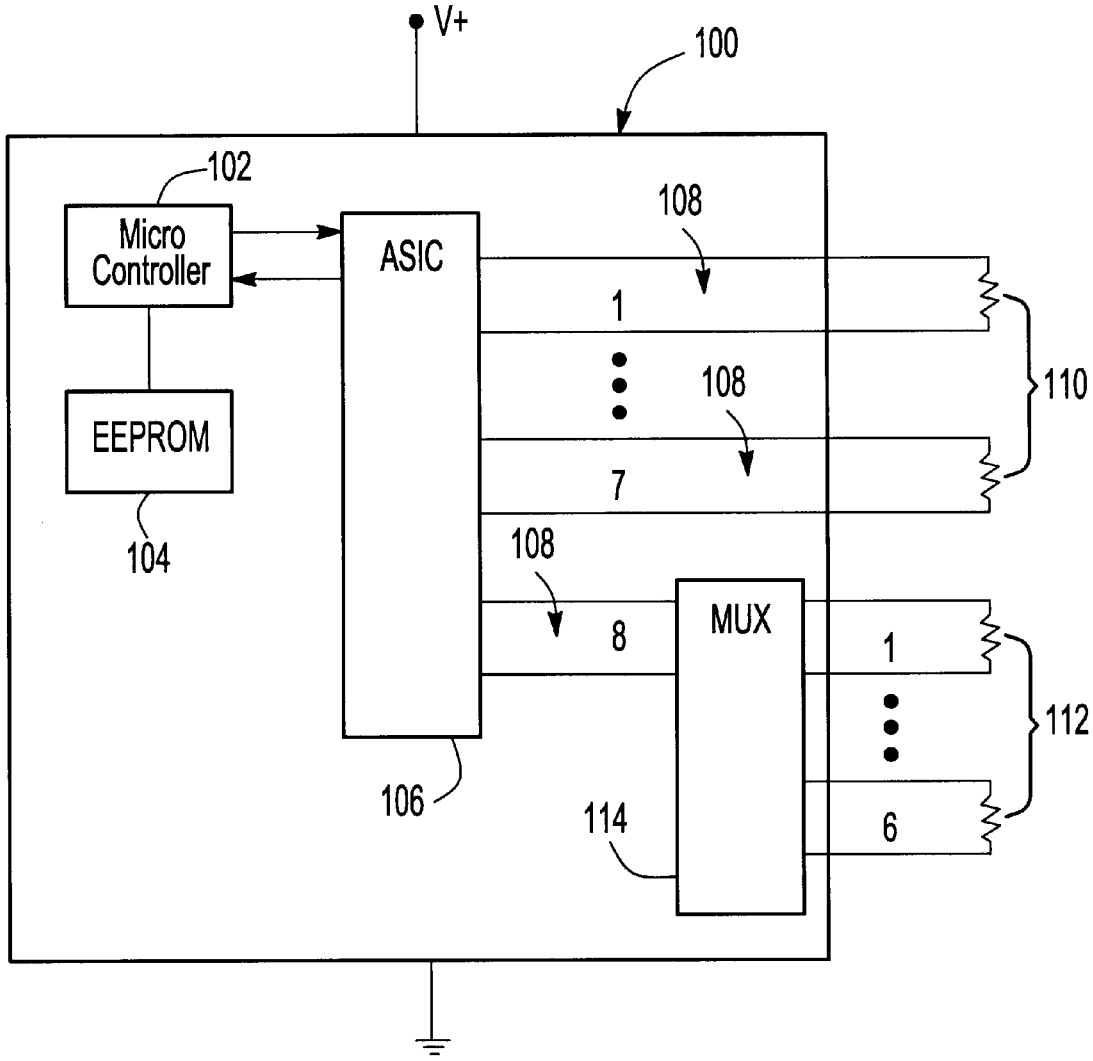
FIG. 1 is a block diagram illustrating a control module according to one embodiment of the invention.

FIG. 1 illustrates a control module 100 according to one embodiment of the invention. The control module 100 is connected between a voltage source V+ and ground in any known manner.

The control module 100 includes a microcontroller 102 and an EEPROM 104. The microcontroller 102 is connected to one or more application specific integrated circuits (ASICs) 106. Each ASIC 106 has two or more loops 108. Each loop 108 may either contain a squib 110 or a replacement resistor 112 associated with a vehicle device (not shown). The embodiment shown in FIG. 1 illustrates a control module 100 having diagnostic circuitry for detecting a difference between a vehicle platform having thirteen squib loops and one having seven squib loops and up to six replacement resistor loops. Note, however, that the control module 100 may have any number of squib loops and replacement resistor loops without departing from the scope of the invention.

As noted above, the replacement resistors 112 are placed in vehicle components, such as seats and headliners, which do not contain any squib-deployable device. If a seat contains an airbag, the seat would contain a squib 110 for deploying the airbag. The squib 110 would be connected to the ASIC 106 in its own squib loop, allowing the ASIC 106 to diagnose the squib 110. If a seat does not contain an airbag, however, it will contain a replacement resistor 112 instead of the squib 110. The loop 108 containing the replacement resistor 112 is also diagnosed by the ASIC 106. By checking the resistor value in each loop 108, the ASIC 106 can determine whether a given loop has a squib 110 or a replacement resistor 112. From this information, the ASIC 106 can also detect whether a given loop has the correct component; for example, if the ASIC 106 detects a replacement resistor 112 in a loop 108 that should contain a squib 110 or vice versa, this indicates that the installed vehicle component is an incorrect component. The ASIC 106 may then generate a signal indicating a misbuild.

In the embodiment of FIG. 1, an eight-loop ASIC 106 is configured to diagnose a seven squib loop system. To ensure that the control module 100 is placed in a system having seven squib-activated devices (and not thirteen squib-activated devices), the microcontroller 102 checks the ASIC 106 to ensure that there are six replacement resistor loops. Rather than populating another ASIC 106 to provide the diagnostics for the six replacement resistor loops, the inventive control module 100 includes a multiplexer 114 connected to the spare deployment loop in the ASIC 106 and controlled by the microcontroller 104. In this example, the eight-loop ASIC 106 has seven loops containing squibs 110 and one loop left over. This leftover loop is connected to the multiplexer 114. The multiplexer 114 then branches to form up to six loops containing replacement resistors 112. These six replacement resistor loops allow diagnosis of six replacement resistors without requiring an additional ASIC 106) to provide additional loop capacity. Instead, the ASIC 106 can diagnose the replacement resistors 112 with only one ASIC loop.

As a result, the inventive control module 100 can diagnose multiple replacement resistor loops using only a single loop in the ASIC 106. This eliminates the need to include any additional ASICs simply to detect and diagnose the replacement resistors 112. Because multiplexers 114 are significantly less expensive than ASICs, the invention reduces the cost of the control module 100 while still allowing detection of multiple replacement resistor 112 loops. Further, even if multiple ASICs are needed for a given vehicle design, smaller ASICs can be used because a single ASIC loop can, in conjunction with the multiplexer 114, be used to diagnose multiple replacement resistors 112. By accurately detecting the presence of squibs 110 and replacement resistors 112, the inventive control module 100 prevents vehicles against misbuilds during component installation and replacement.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A control module for a vehicle having at least one device containing a squib and at least one device containing a replacement resistor, the control module comprising:

a circuit having a plurality of loops, wherein at least one loop is a squib loop containing the squib; and a multiplexer connected to at least one of said plurality of loops, wherein the multiplexer forms at least one replacement resistor loop containing the replacement resistor.

2. The control module of claim 1, wherein the vehicle contains a plurality of squibs and a plurality of replacement resistors, and wherein the ASIC has a plurality of squib loops, each squib loop containing one of said plurality of squibs.

3. The control module of claim 2, wherein the multiplexer forms a plurality of replacement resistor loops, each replacement resistor loop containing one of said plurality of replacement resistors.

4. The control module of claim 1, further comprising a microcontroller that controls at least one of the circuit and the multiplexer.

5. A control module for a vehicle having a first plurality of devices each containing a squib and a second plurality of devices each containing a replacement resistor, the control module comprising:

an application specific integrated circuit (ASIC) having a plurality of loops, wherein at least one loop is a squib loop containing the squib in one of said first plurality of devices;

a multiplexer connected to at least one of said plurality of loops, wherein the multiplexer forms a plurality of replacement resistor loops that each containing the replacement resistor in one of said second plurality of devices; and a microcontroller that controls operation at least one of the ASIC and the multiplexer.

6. The control module of claim 5, wherein the microcontroller controls operation of both the ASIC and the multiplexer.

7. A method of diagnosing a first plurality of vehicle devices each containing a squib and a second plurality of vehicle devices each containing a replacement resistor, the method of comprising:

connecting each squib in said first plurality of vehicle devices to a circuit to form a plurality of squib loops;

connecting at least one of the loops in the circuit to a multiplexer; and connecting each replacement resistor to the multiplexer to form a plurality of replacement resistor loops; and monitoring the plurality of squib loops and the plurality of replacement resistor loops.

* * * * *